(12) United States Patent
Demizu et al.

(10) Patent No.: US 7,409,246 B2
(45) Date of Patent: Aug. 5, 2008

(54) APPARATUS AND METHOD FOR EVALUATING EQUIPMENT OPERABILITY, AND EQUIPMENT OPERABILITY EVALUATING PROGRAM

(75) Inventors: Koji Demizu, Kawasaki (JP); Naoyuki Nozaki, Kawasaki (JP); Masayuki Kidera, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 307 days.

(21) Appl. No.: 11/391,249

(22) Filed: Mar. 29, 2006

(65) Prior Publication Data

US 2007/0168144 A1    Jul. 19, 2007

(30) Foreign Application Priority Data

Dec. 22, 2005   (JP)   ............... 2005-369462

(51) Int. Cl.
*G06F 19/00*   (2006.01)
(52) U.S. Cl. ........................... 700/8; 345/31
(58) Field of Classification Search .................. 700/98, 700/108, 178, 179; 345/31, 119; 702/22; 703/118, 7
See application file for complete search history.

(56) References Cited

U.S. PATENT DOCUMENTS 6,205,367 B1    3/2001   Arita et al.
6,901,356 B1*   5/2005   Arita ............................. 703/7
2004/0043368 A1*   3/2004   Hsieh et al. ................. 434/262
2005/0162419 A1*   7/2005   Kim et al ..................... 345/419

FOREIGN PATENT DOCUMENTS

| JP | 07-110804 | 4/1995 |
| JP | 10-240791 | 9/1998 |
| JP | 2003-271891 | 9/2003 |

\* cited by examiner

*Primary Examiner*—Kidest Bahta
(74) *Attorney, Agent, or Firm*—Staas & Halsey LLP

(57) ABSTRACT

When an input unit of the equipment operability evaluating apparatus selects the human body type of the human body model and a scenario, the posture calculation unit calculates an appropriate operating posture of the human body model having the physique of the selected human body type for each of the supposed operations set by the supposed operation setting unit, and the simulation unit arranges an equipment model and a human body model having the calculated operating posture in the three-dimensional virtual space, and displays the view image as an image of the three-dimensional virtual space viewed from the point of view of the human body model. The operation recording unit records the operation result of the equipment model on the view image, and the operability evaluation unit evaluates the operability of the equipment based on the recorded operation result.

12 Claims, 12 Drawing Sheets

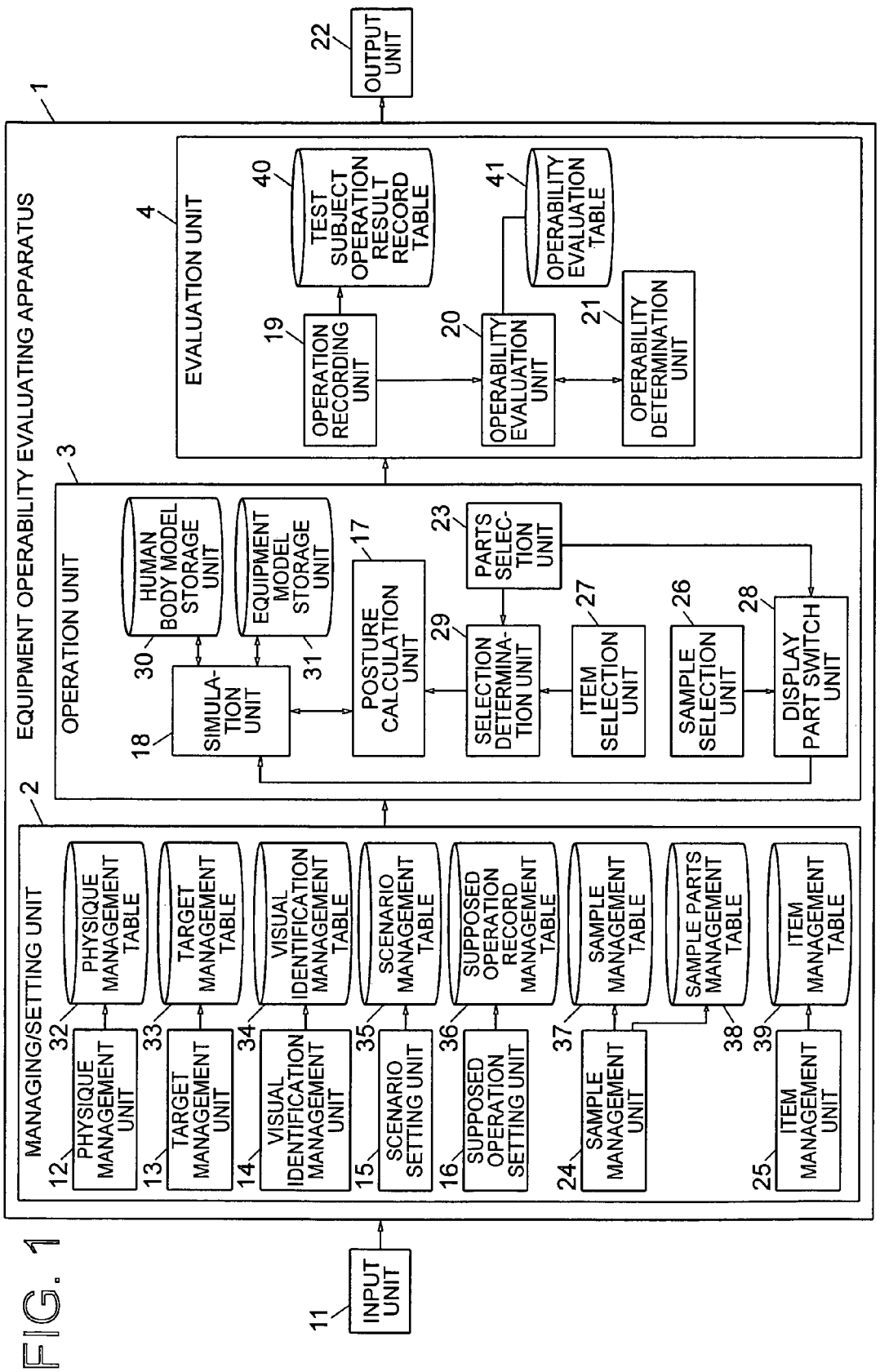

FIG. 2

| HUMAN BODY TYPE | HEIGHT | BRACHIUM | FOREARM | ACTIVE | HUMAN BODY TYPE ID |
|---|---|---|---|---|---|
| JAPANESE FEMALE 5% TILE VALUE | 1534.2 | 195 | 143 | | V1 |
| JAPANESE FEMALE 50% TILE VALUE | 1640.2 | 210 | 156 | | V2 |
| JAPANESE MALE 50% TILE VALUE | 1850.0 | 230 | 180 | | V3 |
| NORTH AMERICAN MALE 99% TILE VALUE | 1950.0 | 260 | 200 | ✓ | V4 |
| ⋮ | ⋮ | ⋮ | ⋮ | ⋮ | ⋮ |

FIG. 3

| ITEM | TARGET ID | CONTROL POINT | TARGET PART |
|---|---|---|---|
| 1 | T1 | RIGHT HAND | A. part |
| 2 | T2 | RIGHT HAND | B. part |
| 3 | T3 | LEFT HAND | C. part |
| ⋮ | ⋮ | ⋮ | ⋮ |

FIG. 4

| ITEM | VISUAL IDENTIFICATION ID | VISUAL IDENTIFICATION TARGET PART |
|---|---|---|
| 1 | S1 | A. part |
| 2 | S2 | B. part |
| 3 | S3 | C. part |
| 4 | S4 | D. part |
| ⋮ | ⋮ | ⋮ |

FIG. 5

| ITEM | SCENARIO ID | NAME | SUPPOSED OPERATION ID ORDER |
|---|---|---|---|
| 1 | P1 | DEPOSIT | H1·H2·H5 |
| 2 | P2 | WITHDRAWAL | H1·H2·H3·H8 |
| 3 | P3 | INQUIRY FOR BALANCE | H1·H2·H3 |
| ⋮ | ⋮ | ⋮ | ⋮ |

FIG. 6

| ITEM | SUPPOSED OPERATION ID | SUPPOSED OPERATION NAME | HUMAN BODY REFERENCE POSITION | EQUIPMENT POSITION | TARGET ID | VISUAL IDENTIFI- CATION ID | VARIATION ID | ITEM ID | SUPPOSED TIME |
|---|---|---|---|---|---|---|---|---|---|
| 1 | H1 | TRANSACTION SELECTION | 0,0,0 | 200,200,0 | T1 | S1 | B1 | — | 10 SECONDS |
| 2 | H2 | INSERTION OF CARD | 0,0,0 | 200,200,0 | T2 | S2 | — | I2 | 5 SECONDS |
| 3 | H3 | INPUT OF PASSWORD | 0,0,0 | 200,200,0 | T3 | S3 | — | — | 5 SECONDS |
| 4 | H4 | INSERTION OF PASSBOOK | 0,0,0 | 200,200,0 | T4 | S4 | — | — | 5 SECONDS |
| ... | ... | ... | ... | ... | ... | ... | ... | ... | ... |

| ITEM | SCENARIO ID | HUMAN BODY TYPE | SUPPOSED OPERATION ITEM | SELECTION PARTS | TIME | SAMPLE ID | PART DETERMINATION | ITEM DETERMINATION | OPERABILITY DETERMINATION |
|---|---|---|---|---|---|---|---|---|---|
| 1 | P1 | V1 | 1 | B. part | — | — | NG | — | |
| 2 | P1 | V1 | 1 | A. part | 20 SECONDS | BB1 | OK | — | NG |
| 3 | P1 | V1 | 2 | B. part | 8 SECONDS | — | OK | OK | OK |
| ... | ... | ... | ... | ... | ... | ... | ... | ... | ... |

| | 1.5T1>T2 | 2T1>T2>=1.5T1 | T2>=2T1 |
|---|---|---|---|
| RANK | A | B | C |

| ITEM | VARIATION ID | TARGET PART | SAMPLE ID1 | SAMPLE ID2 | SAMPLE ID3 | DISPLAY TARGET |
|---|---|---|---|---|---|---|
| 1 | B1 | F. part | BB1 | BB2 | BB3 | F. part |
| 2 | B2 | H. part | BB5 | BB7 | | BB5 |
| ⋮ | ⋮ | ⋮ | ⋮ | ⋮ | ⋮ | ⋮ |

| ITEM | SAMPLE ID | PART |
|---|---|---|
| 1 | BB1 | L. part |
| 2 | BB2 | K. part |
| 3 | BB3 | G. part |
| ⋮ | ⋮ | ⋮ |

| ITEM | ITEM ID | PART |
|---|---|---|
| 1 | I1 | PASSBOOK |
| 2 | I2 | CARD |
| 3 | I3 | DRIVER |
| ⋮ | ⋮ | ⋮ |

⎯39

FIG. 13
(PART A) 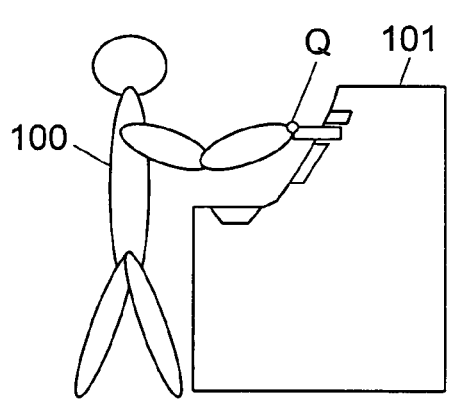
(PART B) 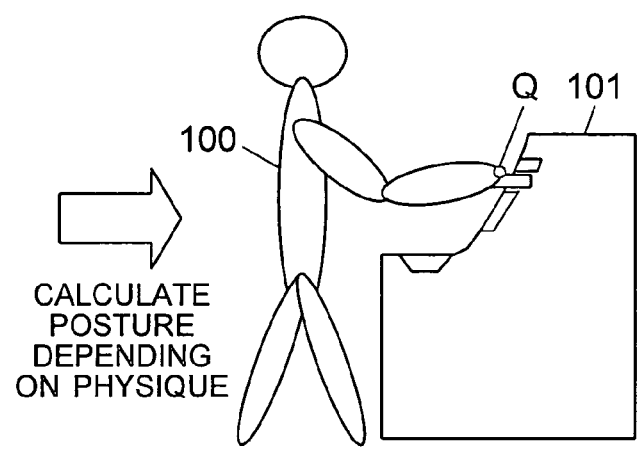
CALCULATE POSTURE DEPENDING ON PHYSIQUE

APPARATUS AND METHOD FOR EVALUATING EQUIPMENT OPERABILITY, AND EQUIPMENT OPERABILITY EVALUATING PROGRAM

CROSS-REFERENCE TO RELATED APPLICATIONS

This application claims the conventional priority based on Japanese Application No. 2005-369462, filed on Dec. 22, 2005, the disclosures of which are incorporated herein by reference.

BACKGROUND OF THE INVENTION

1. Field of the Invention

The present invention relates to an apparatus and method for evaluating equipment operability and an equipment operability evaluating program, and more specifically to an apparatus and method for evaluating equipment operability and an equipment operability evaluating program capable of evaluating the operability of equipment based on the operation of an equipment model on an image displaying the view of a human body model in a three-dimensional virtual space.

2. Description of the Related Art

The operability of equipment is verified by a recording staff who records the process of a test subject that has never operated the equipment actually operating the equipment. However, the physique of a person depends on the sex, race and so on and when the operability of equipment is evaluated, it is necessary to evaluate the operability based on the physique of each test subject. In the method of recording the process of a test subject operating equipment, it is hard to practically collect all physiques. Therefore, it is hard to correctly evaluate the operability of equipment. Additionally, although a problem can be detected by evaluating the operability of equipment, a sufficient period in which a design amendment can be made to improve the equipment is not permitted in most cases. As a result, evaluating the operability at an early designing stage is demanded.

In the field of various simulations such as digital mockup and so on, different body types depending on the race, sex and so on are represented by human body models using statistical values, and the human body models are arranged in a virtual space, thereby virtually experiencing the view of the real world in the view of a human body model, and successfully determining the appearance of equipment and visibility of a specific portion. In this method, a layout check and so on as to whether or not necessary parts are arranged in a work range of a test subject of each physique can be made.

Additionally, a technique of defining the user interface of equipment and the corresponding reaction of the equipment (for example, blinking an LED by a press of a specific part and so on), and checking the operation of a user interface unit has conventionally been developed.

Furthermore, patent document 1 (Japanese Patent Laid-open No. 10-240791) describes the equipment operability evaluation support apparatus for supporting the process of evaluating the operability of the equipment by arranging an equipment model as a copy of the shape of the equipment to be designed or the equipment to be laid out in a simulation space, arranging the human body model for which an operation of equipment is supposed, and allowing the human body model to operate in the simulation space.

Patent document 2 (Japanese Patent Laid-open No. 2003-271891) describes the merchandise virtual experience system capable of experiencing the size, function, or operation of the merchandise not realized at the current situation by controlling a pseudo operation device capable of virtually operating merchandise or a part of it and a virtual space generation device for generating a virtual space.

Patent Document 3 (Japanese Patent Laid-open No. 7-110804) describes the prototype device capable of allowing a third party to objectively verifying the operability by adding a modulation corresponding to characteristics of five senses of a person to operation input coordinates of the operation unit of equipment and a display output signal.

According to the study of the applicant of the present invention, there is the following problem even though a human body model is arranged in the three-dimensional virtual space, a designer checks the layout of equipment by experiencing the view with various physiques, and defines and verifies the operation of a user interface in the technique of the above described digital mockup and so on. That is, it is difficult for a test subject to verify the operability not about each operation of equipment but about whether or not a series of (plural) operations can be smoothly performed until a purpose is attained.

Concretely, when equipment is used, it is necessary to verify all points of operability such as the maintenance, composition, decomposition and so on by a maintenance staff and so on in addition to various operations of an end user. On the other hand, there can be a case in which an (operation) purpose can be attained only after a number of operations supposed for equipment are continuously performed as a series of operations. For example, the purpose of "deposit" in equipment called an automatic teller machine (ATM) includes a plurality of operations such as operating a touch panel, inserting a card, depositing cash and so on. There has been no device for evaluating the operability (serial operability until a purpose is attained) as to whether or not it is possible for a test subject to attain a purpose by smoothly operating the equipment when the test subject having less knowledge (than the designer of the equipment) about the equipment operates the equipment in a virtual space relating to a purpose formed by these plurality of operations.

Furthermore, according to the study of the applicant of the present invention, when the operability of equipment is evaluated-relating to a purpose formed by a plurality of operations, it is necessary to change the posture of a human body model when the plurality of operations are sequentially performed. However, since there has been no concept of evaluating the operability of equipment relating to a purpose formed by a plurality of operations, there has been no device for changing the posture of a human body model during the process.

SUMMARY OF THE INVENTION

It is an object the present invention to provide an apparatus for evaluating equipment operability which evaluates the operability of equipment based on the result of operating an equipment model using a human body model with an appropriate posture although the human body model is exchanged.

It is another object of the present invention to provide a method for evaluating equipment operability for evaluating the operability of equipment based on the result of operating an equipment model using a human body model with an appropriate posture although the human body model is exchanged.

It is still another object of the present invention to provide an equipment operability evaluating program for evaluating the operability of equipment based on the result of operating an equipment model using a human body model with an appropriate posture although the human body model is exchanged.

The apparatus for evaluating equipment operability of the present invention evaluates the operability of equipment. The apparatus comprises a physique management unit managing body information about a human body model as a copy of the shape of a human body, a visual identification management unit managing visual identification information as information about a sight line of the human body model, a target management unit managing a human body part of the human body model and a target position to which the human body part is to be moved as target information, a supposed operation setting unit setting a plurality of supposed operations each of which is a supposed operation of the equipment as associated with the visual identification information and the target information, a posture calculation unit calculating a posture of the human body model which performs the set supposed operation based on the body information about the specified human body model and at least the target information corresponding to the supposed operation set by the supposed operation setting unit, a simulation unit arranging an equipment model as a copy of a shape of the equipment and the human body model having the posture calculated by the posture calculation unit in a three-dimensional virtual space, and displaying a view image as an image of the three-dimensional virtual space from the point of view of the human body model having the posture, an operation information input unit inputting operation information about the equipment model in the view image, an operation recording unit recording an operation result of the equipment model based on the operation information about the equipment model input by the operation information input unit, and an operability evaluation unit evaluating the operability of the equipment based on the recorded operation result of the equipment model.

Preferably, the apparatus of the present invention further comprises a scenario setting unit setting a scenario which is a purpose of operating the equipment and is formed by a plurality of supposed operations. The supposed operation setting unit sets the supposed operations for each of the set scenario, and the posture calculation unit calculates a posture of the human body model which performs the set supposed operation based on the body information of the specified human body model and the specified scenario.

Preferably, in the apparatus of the present invention, the supposed operation setting unit sets a supposed time as a time supposed from the start to the end of the supposed operation, the operation recording unit records the operation time of the equipment model on the view image, and the operability evaluation unit evaluates the operability of the equipment based on the result of the comparison between the recorded operation time of the equipment model and the set supposed time.

The method for evaluating equipment operability of the present invention evaluates the operability of equipment using an apparatus for evaluating equipment operability. The method comprises managing body information about a human body model as a copy of a shape of a human body, managing visual identification information as information about a sight line of the human body model, managing a human body part of the human body model and a target position to which the human body part is to be moved as target information, setting a plurality of supposed operations each of which is a supposed operation of the equipment as associated with the visual identification information and the target information, calculating a posture of the human body model which performs the set supposed operation based on the body information about the specified human body model and at least the target information corresponding to the set supposed operation, arranging an equipment model as a copy of a shape of the equipment and the human body model having the calculated posture in a three-dimensional virtual space, and displaying a view image as an image of the three-dimensional virtual space from a point of view of the human body model having the posture, recording an operation result of the equipment model based on an inputted operation information about the equipment model on the view image, and evaluating the operability of the equipment based on the recorded operation result of the equipment model.

The equipment operability evaluating program of the present invention evaluates operability of equipment. The program causes a computer to execute managing body information about a human body model as a copy of a shape of a human body, managing visual identification information as information about a sight line of the human body model, managing a human body part of the human body model and a target position to which the human body part is to be moved as target information, setting a plurality of supposed operations each of which is a supposed operation of the equipment as associated with the visual identification information and the target information, calculating a posture of the human body model which performs the set supposed operation based on the body information about the specified human body model and at least the target information corresponding to the set supposed operation, arranging an equipment model as a copy of a shape of the equipment and the human body model having the calculated posture in a three-dimensional virtual space, and displaying a view image as an image of the three-dimensional virtual space from a point of view of the human body model having the posture, recording an operation result of the equipment model based on an inputted operation information about the equipment model on the view image, and evaluating the operability of the equipment based on the recorded operation result of the equipment model.

The apparatus and method for evaluating equipment operability and the equipment operability evaluating program of the present invention calculate the posture of a human body model in the supposed operation for each of a plurality of supposed operations based on the body information about a specified human body model and at least the target information corresponding to the set supposed operation, arrange the human body model having the calculated posture and the equipment model in the three-dimensional virtual space, display a view image as an image of the three-dimensional virtual space viewed from the point of view of the human body model, record the operation result of the equipment model in the view image, and evaluate the operability of the equipment based on the recorded operation result. Therefore, when a purpose is attained by continuously performing a plurality of operations of equipment, the operability (serial operability until a purpose is attained) can be evaluated as to whether or not a practical test subject can operate equipment in a virtual space and smoothly perform a series of (a plurality of) operations until the purpose can be attained. Therefore, according to the present invention, even when a human body model is exchanged, a view image of the human body model having an appropriate operating posture can be displayed, and the operability of equipment can be evaluated based on the operation result of the equipment model in the view image.

The apparatus for evaluating equipment operability of the present invention sets a scenario which is a purpose of operating equipment and is formed by a plurality of supposed operations, and changes (calculates) the posture of a human body model which operates set supposed operations when the plurality of operations are sequentially performed based on the body information about a specified human body model and the specified scenario for each set scenario. Therefore, according to the present invention, the operability of equipment in a series of operations performed until the purpose of the operations of the equipment is attained can be evaluated. For example, it is correctly evaluated by changing the posture of a human body model whether or not the purpose of "deposit" in equipment of an automatic teller machine (ATM) can be attained by smoothly performing a plurality of operations such as operating a touch panel, inserting a card, depositing cash and so on.

The apparatus for evaluating equipment operability of the present invention sets a supposed time as a time supposed from the start to the end of the supposed operation, and evaluates the operability of equipment based on the result of the comparison between the supposed time and the operation time of the equipment model in the view image. Therefore, according to the present invention, the operability of equipment in a series of operations until the purpose of the operation of the equipment is attained can be objectively evaluated for each supposed operation.

BRIEF DESCRIPTION OF THE DRAWINGS

FIG. 1 shows an example of a structure of an apparatus for evaluating equipment operability according to the present invention.

FIG. 2 shows an example of a data structure of a physique management table.

FIG. 3 shows an example of a data structure of a target management table.

FIG. 4 shows an example of a data structure of a visual identification management table.

FIG. 5 shows an example of a data structure of a scenario management table.

FIG. 6 shows an example of a data structure of a supposed operation record management table.

FIG. 8 shows an example of a data structure of a test subject operation result recording table.

FIG. 9 shows an example of a data structure of an operability evaluation table.

FIG. 10 shows an example of a data structure of a sample management table.

FIG. 11 shows an example of a data structure of a sample part management table.

FIG. 12 shows an example of a data structure of an item management table.

FIG. 13 is an explanatory view showing a calculation of an operating posture of a human body model by a simulation unit.

DETAILED DESCRIPTION OF THE PREFERRED EMBODIMENTS

Before describing the embodiments of the present invention, the abstract of the present invention will be described below for easy understanding of the present invention.

Normally, a plurality of operations are performed when a user of equipment performs the operations of the equipment to attain the purpose of the operations (for example, deposit). The purpose of the operations cannot be attained unless each operation is performed in a correct order. The apparatus for evaluating equipment operability of the present invention virtually verifies whether or not a user of certain equipment can correctly operate the equipment within an appropriate time in an operation order expected by the designer of the equipment.

A designer of the equipment sets a scenario to be attained using the equipment in the apparatus for evaluating equipment operability. A scenario is a purpose of operating the equipment, and is formed by a plurality of supposed operations. The plurality of supposed operations are a series of operations to be performed in the described order. For each supposed operation forming part of a scenario, the designer sets, for example, in addition to the position information about a human body model arranged in the three-dimensional virtual space, the position information about an equipment model and so on, the target information indicating which human body part of the human body model is to be moved to which target information, and the supposed time supposed for an operation to be performed. A target position refers to the position as an operation target by the equipment model. When there are variations of displays and forms for the parts of the equipment model when a supposed operation is performed, a variation is set using a part having the variation as a variation target part. The variation of the variation target part is formed by one or more of sample parts. In an embodiment of the present invention, a variation of a variation target part refers to one or more of sample parts replacing the variation target part, and one or more of sample parts replacing an accessory part provided for the variation target part.

Figure 17:
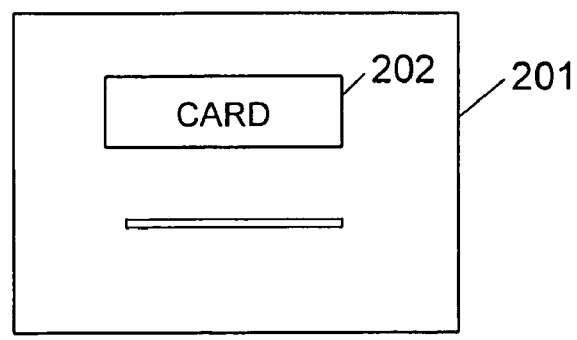
FIG. 17 shows an example of a target part.

For example, in FIG. 17 showing an example of a variation target part, a card slot 201 is assumed to be a variation target part. When there is a variation (of a expression) such as a character style, color and so on for an accessory part 202 displaying the characters of "card" provided for the card slot 201, the designer sets one or more of sample parts replacing the accessory part 202 and having different characters and colors as variations of the card slot 201. In an embodiment of the present invention, the card slot 201 provided with a part replacing the accessory part 202 can be a sample part, or a part itself replacing the accessory part 202 can be set as a sample part.

Furthermore, when it is assumed that items such as a passbook, a card, a driver, a key and so on are used in a supposed operation of the equipment, the designer sets an item for the supposed operation for which a use of an item is supposed.

Next, a test subject who verifies the operation of the equipment operates the equipment according to the set scenario. When the test subject selects a scenario to be verified and a human body type stored in advance in a storage unit, the apparatus for evaluating equipment operability calculates the operating posture of the human body model based on the body information about the selected human body type and the set target information, and arranges the human body model having the calculated operating posture together with an equipment model in the three-dimensional virtual space. The apparatus for evaluating equipment operability also displays a view image of the three-dimensional virtual space viewed from the point of view of the human body model.

The test subject selects a target part of the equipment model in the displayed view image. The apparatus for evaluating equipment operability records the selected part, and determines whether or not the part has been correctly selected. That is, the apparatus determines whether or not a target part corresponding to the current supposed operation has been selected.

When the part is correctly selected, the apparatus for evaluating equipment operability calculates the operating posture corresponding to the next supposed operation, and allows the human body model to take the operating posture corresponding to the next supposed operation. The apparatus for evaluating equipment operability displays an item on a view image, allows the test subject to select an item, and determines whether or not the item has been correctly selected.

The apparatus for evaluating equipment operability of the present invention records the time (operation time) from the time when the part of the equipment can be selected to the time when the test subject selects the part, compares the operation time with the supposed time, and evaluates the operability of the equipment. For example, when one or more of sample parts replacing a variation target part are set, the apparatus for evaluating equipment operability replaces the variation target part with a sample part selected by the test subject from among the set sample parts, and displays the selected sample part on the view image.

When a part replacing an accessory part is set as a sample part, the apparatus for evaluating equipment operability can replace the accessory part provided for the variation target part with the sample part selected by the test subject and display the sample part on the view image.

FIG. 1 shows an example of a structure of the apparatus for evaluating equipment operability according to the present invention. An equipment operability evaluating apparatus 1 shown in FIG. 1 is a processing device or a computer for evaluating the operability of the equipment based on the supposed operation predetermined for equipment and the actual operation of an equipment model on the image showing the view of a human body model in the three-dimensional virtual space. The human body model refers to a model as a copy of the shape of the human body, and the equipment model refers to a model as a copy of the shape of equipment.

The equipment operability evaluating apparatus 1 includes an input unit 11, a managing/setting unit 2, an operation unit 3, an evaluation unit 4, and an output unit 22. The input unit 11 inputs instruction information for the equipment operability evaluating apparatus 1. The input unit 11 inputs, for example, the body information about the test subject of the equipment operability evaluating apparatus 1 and the scenario information as the instruction information. The managing/setting unit 2 sets and manages the necessary information for the operation of the equipment model using a human body model. The managing/setting unit 2 includes a physique management unit 12, a target management unit 13, a visual identification management unit 14, a scenario setting unit 15, a supposed operation setting unit 16, a sample management unit 24, and an item management unit 25. The operation unit 3 operates the equipment model arranged in the three-dimensional virtual space. The operation unit 3 includes a posture calculation unit 17, a simulation unit 18, a parts selection unit 23, a sample selection unit 26, an item selection unit 27, a display part switch unit 28, and a selection determination unit 29. The evaluation unit 4 evaluates the operability of equipment. The evaluation unit 4 includes an operation recording unit 19, an operability evaluation unit 20, and an operability determination unit 21 described later. The output unit 22 outputs a determination result of the operability of the equipment. The output unit 22 outputs, for example, the contents of a test subject operation result record table 40 (described later) recording the determination result of the operability of the equipment.

The physique management unit 12 manages the body information about a human body model arranged in the three-dimensional virtual space. The managed body information is stored in a physique management table 32.

The target management unit 13 manages target information. The target information to be managed is stored in a target management table 33. The target management unit 13 manages, for example, a control point of a human body model in the three-dimensional virtual space and a target part which is a part at a target position to which the control point is to be moved as target information. A control point refers to, for example, a human body part to be operated by a test subject such as a right or left hand and so on. The target management unit 13 can manage as a target information the control point and the coordinates information about the target position to which the control point is to be moved.

The visual identification management unit 14 manages visual identification information. Visual identification information is the information about a sight line of a human body model. The managed visual identification information is stored in a visual identification management table 34. The visual identification management unit 14 manages as visual identification information, for example, the information about a visual identification target part which is a part to be visually recognized by a human body model among parts provided for the equipment model arranged in the three-dimensional virtual space by the simulation unit 18 described later.

The scenario setting unit 15 sets scenario information in a scenario management table 35. The scenario setting unit 15 sets as scenario information, for example, a scenario and a supposed operation as an operation supposed to attain the scenario. The scenario setting unit 15 sets as scenario information, for example, a scenario of "deposit", and supposed operations of "selecting a transaction", "inserting a card", and "inputting money".

When there is one scenario to be set, setting the scenario can be omitted. That is, the generation of the scenario management table 35 can be omitted. In this case, in the scenario setting unit 15 or supposed operation setting unit 16, the execution order can be specified using a plurality of supposed operation IDs in a supposed operation record management table 36. Thus, a real (one) scenario can be set.

The supposed operation setting unit 16 sets the position information about the human body model arranged in the three-dimensional virtual space, the target information, the visual identification information, and the supposed time for each supposed operation set by the scenario setting unit 15 in the supposed operation record management table 36. The supposed time is the time supposed from the start to the end of each supposed operation. In the embodiment of the present invention, the supposed operation setting unit 16 can further set information identifying the variation of a variation target part of each supposed operation and an item used during the supposed operation in the supposed operation record management table 36.

The posture calculation unit 17 calculates the posture of a human body model for moving a control point to a target position based on the instruction information input by the input unit 11 and the information set in the supposed operation record management table 36. For example, when the input unit 11 inputs the body information (body information about a human body model) about a test subject and the scenario information, the posture calculation unit 17 refers to the scenario management table 35 and the supposed operation record management table 36, and designates the target information (information about control point and target position) corresponding to the supposed operation forming the input scenario and a visual identification target part. In a case the target information can be designated, it is not always necessary to designate a visual identification target part. The posture calculation unit 17 can designate the target position corresponding to the subsequent supposed operation of the current supposed operation. The posture calculation unit 17 then calculates the posture for moving the control point of the human body model having the input body information to a target position, and the posture for allowing the human body model to visually identify the visual identification target part. The calculated posture is the operating posture of the human body model.

In an embodiment of the present invention, the posture calculation unit 17 can also calculate the posture for moving the control point of the human body model having the input body information to a target position, and the posture for allowing the human body model to visually identify the target position as an operating posture. Furthermore, the posture calculation unit 17 can calculate the posture for moving the control point of the human body model having the input body information to a target position, the posture for allowing the human body model to visually identify the visual identification target part, and the posture with which the target position corresponding to the subsequent supposed operation of the current supposed operation can be within the visual range of the human body model as an operating posture.

The posture calculation unit 17 outputs, for example, the positions of the neck joint, the shoulder joint, and the arm joint, the angle of the wrist joint, and the position of eyes of the human body model as the posture information. Concretely, the posture calculation unit 17 calculates the operating posture by the known method using, for example, the inverse kinematics (IK). Inverse kinematics generally refers to the function of moving an upper child and a parent object when a grandchild moves by setting a hierarchical structure of objects as a parent, a child, and a grandchild.

The simulation unit 18 arranges an equipment model and a human body model in the three-dimensional virtual space, and displays a view image of the three-dimensional space viewed from the point of view of the human body model. For example, the simulation unit 18 extracts the equipment model from an equipment model storage unit 31 and arranges the extracted model in the three-dimensional virtual space, and extracts the human body model from a human body model storage unit 30 and arranges the extracted model in the three-dimensional virtual space. Additionally, the simulation unit 18 allows the human body model arranged in the three-dimensional virtual space to take an operating posture according to the posture information output from the posture calculation unit 17.

Figure 16:
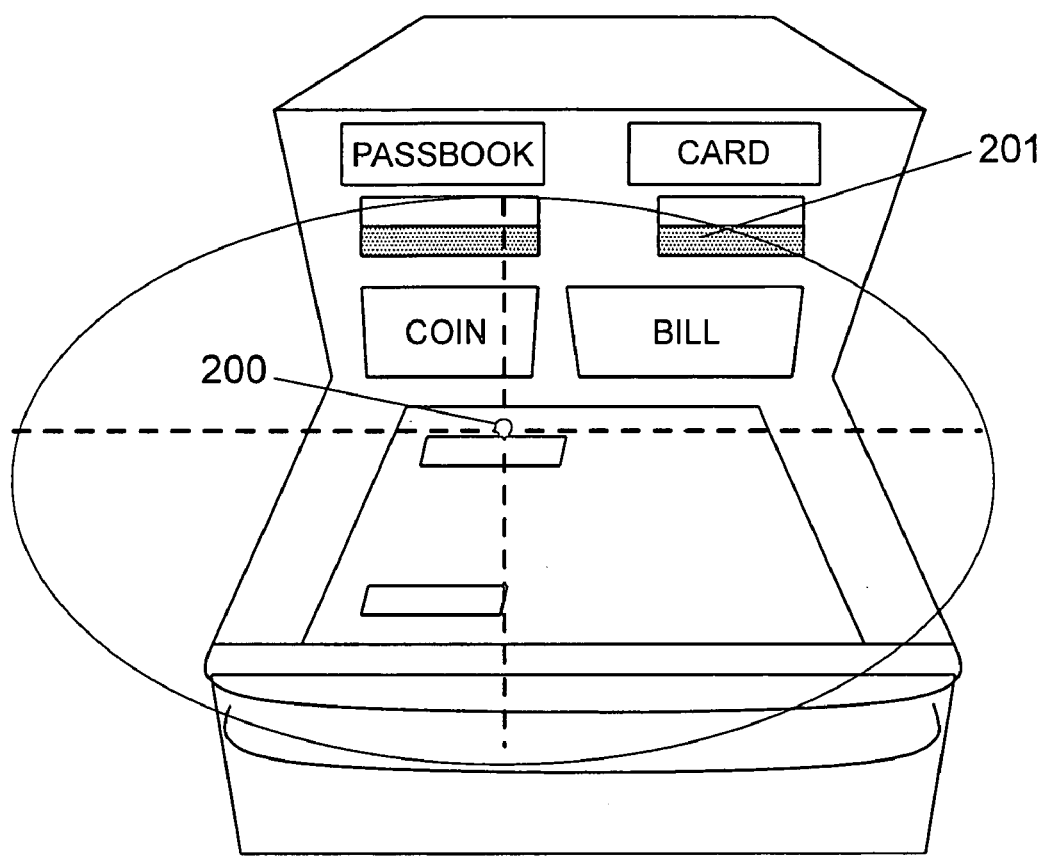
FIG. 16 shows an example of a view image of the human body model.

For example, as shown in FIG. 16 described later, the simulation unit 18 displays a view image of the human body model having the operating posture. The simulation unit 18 can display all items (name and images of items) set in the supposed operation record management table 36 on the view image. The simulation unit 18 can also display a sample part forming a variation of a target part corresponding to a supposed operation on the view image.

The operation recording unit 19 records an operation result of a test subject on the view image displayed by the simulation unit 18 in the test subject operation result record table 40.

The operation recording unit 19 can also record a determination result of the operability of the equipment by the operability determination unit 21 described later in the test subject operation result record table 40.

The operability evaluation unit 20 evaluates the operability of each operation based on the actual operation time (real time) by a test subject and the supposed time set in the supposed operation record management table 36. The operability determination unit 21 determines the operability of equipment based on the evaluation result of the operability by the operability evaluation unit 20. The operability determination unit 21 can also determine the operability of the equipment based on the determination result of the selection determination unit 29 described later.

The parts selection unit 23 selects a part of an equipment model. The parts selection unit 23 is operation information input unit inputting the operation information about an equipment model on the view image of a human body model. For example, on the view image of a human body model, when a target part of the equipment model and an accessory part are specified by clicking the left mouse button and so on, the parts selection unit 23 selects a specified part. The operation information input unit can be considered to include the parts selection unit 23, the sample selection unit 26, the item selection unit 27, and the input unit 11.

The sample management unit 24 manages a sample part. The sample part managed by the sample management unit 24 is, for example, a part replacing a variation target part. The sample management unit 24 can manage a part replacing an accessory part provided for a variation target part as a sample part.

The sample management table 37 stores the variation information about a variation target part formed by a sample part. The sample parts management table 38 stores the information about a sample part.

The item management unit 25 manages an item used during each supposed operation. The item management unit 25 manages an item, for example, a passbook, a card, a driver, a key and so on stored in an item management table 39.

The sample selection unit 26 selects a sample part managed by the sample management unit 24. The sample selection unit 26 is operation information input unit inputting operation information about an equipment model on a view image of a human body model like the above-mentioned parts selection unit 23. For example, when a test subject specifies a sample part on a view image of a human body model, the sample selection unit 26 selects the sample part.

The item selection unit 27 selects an item managed by the item management unit 25. The item selection unit 27 is also operation information input unit inputting the operation information of an equipment model on the view image of a human body model like the above-mentioned parts selection unit 23. For example, when an item to be used by a test subject is specified among the item displayed on the view image of a human body model, the item selection unit 27 selects the specified item.

The display part switch unit 28 replaces the part selected by the parts selection unit 23 with the sample part selected by the sample selection unit 26.

The selection determination unit 29 determines whether or not the parts selection unit 23 correctly selects a part in each supposed operation. The selection determination unit 29 is an operation determination unit determining whether or not an equipment model is operated according to the supposed operation set by the supposed operation setting unit 16.

That is, the selection determination unit 29 determines whether or not the parts selection unit 23 has selected a target part corresponding to each supposed operation. In an embodiment of the present invention, the selection determination unit 29 can also determine whether or not an item has been correctly selected by comparing the item selected by the item selection unit 27 with the item set in the supposed operation record management table 36.

The human body model storage unit 30 stores the information about a human body model. The equipment model storage unit 31 stores the information about an equipment model. The physique management table 32 stores the body information about a human body model. The target management table 33 stores target information. The visual identification management table 34 stores visual identification information. The scenario management table 35 stores scenario information. The supposed operation record management table 36 stores, for example, the position information about a human body model arranged in the three-dimensional virtual space, the target information, the visual identification information, and the supposed time.

The sample management table 37 stores the variation information about a variation target part formed by a sample part. The sample parts management table 38 stores the information about a sample part.

The item management table 39 stores the information about an item used in a supposed operation. The test subject operation result record table 40 stores an operation result of a test subject on the view image of a human body model. An operability evaluation table 41 stores evaluation information for use in evaluating the operability of each supposed operation.

The functions of the above-mentioned equipment operability evaluating apparatus 1 and each component of the apparatus are realized by a CPU and a program executed by the CPU. The program for realizing the present invention can be stored on a computer-readable recording medium, for example, semiconductor memory, a hard disk, a CD-ROM, a DVD and so on can be recorded on these recording media and provided, or can be provided by transmission and reception over a network through a communication interface.

FIG. 2 shows an example of a data structure of a physique management table. The physique management table 32 stores, for example, "height", "brachium", "forearm", "active", "human body type ID" and so on as associated with the "human body type" for each "human body type". The "human body type" stores the type of the statistical value (for example, the value of a height, the value of the length of a brachium, the value of the length of a forearm) of each part of a human body stored in the physique management table 32. For example, as shown in FIG. 2, the "human body type" stores a Japanese female 5% tile value indicating the 5% tile value of a Japanese female, and a North American male 99% tile value indicating the 99% tile value of a North American male.

The "height" stores the value of the height corresponding to the human body type stored in the "human body type". The "forearm" stores the value of the length of a forearm corresponding to the human body type stored in the "human body type". The "active" sets a flag indicating which human body type has been specified. For example, when a value of the height of a test subject is input by the input unit 11, a flag indicating that the human body type has been specified is set in the "active" corresponding to the human body type indicated by the value of the height. In the example in the physique management table 32 shown in FIG. 2, the North American male 99% tile value is specified as a human body type. The "human body type ID" stores an identifier uniquely identifying a human body type.

FIG. 3 shows an example of a data structure of a target management table. The target management table 33 stores "item", "control point", "target part" and so on as associated with the "target ID" for each "target ID". The "target ID" stores an identifier uniquely identifying the target information. The "item" stores the number of each record of the target management table 33. The number of the record is a number of the row in the target management table 33. A record refers to each row (one line) in the target management table 33 (same in other tables). The "control point" stores the name of the control point as a part of a human body model to be moved to a target position. The "target part" stores the name of a target part at the target position. In the example of the target management table 33 shown in FIG. 3, for example, the target ID of "T1" indicates the target information that the right hand of a human body model is to be moved to "A. part".

FIG. 4 shows an example of a data structure of the visual identification management table. The visual identification management table 34 stores "item", "visual identification target part" and so on as associated with the "visual identification ID" for each "visual identification ID". The "visual identification ID" stores an identifier uniquely identifying the visual identification information. The "item" stores the number of each record in the visual identification management table 34. The "visual identification target part" stores the name of a visual identification target part.

FIG. 5 shows an example of a data structure of a scenario management table. The scenario management table 35 stores "item", "name", "supposed operation ID order" and so on as associated with the "scenario ID" for each "scenario ID". The "scenario ID" stores an identifier uniquely identifying the scenario information. The "item" stores the number of each record in the scenario management table 35. The "name" stores the name of a scenario. The "supposed operation ID order" stores the supposed operation ID as an identifier identifying a supposed operation forming the scenario. When there are pluralities of supposed operations forming the scenario, the supposed operation ID identifying each supposed operation is stored as arranged in the operation order.

FIG. 6 shows an example of a data structure of a supposed operation record management table. The supposed operation record management table 36 stores "item", "supposed operation name", "human body reference position", "equipment position", "target ID", "visual identification ID", "variation ID", "item ID", "supposed time" and so on as associated with the "supposed operation ID" for each "supposed operation ID".

The "supposed operation ID" stores an identifier uniquely identifying each supposed operation. The "item" stores the number of each record in the supposed operation record management table 36. The "supposed operation name" stores the name of a supposed operation. The "human body reference position" stores the coordinates of the reference position of a human body model arranged in the three-dimensional virtual space. The "equipment position" stores the coordinates of the position of the equipment model arranged in the three-dimensional virtual space.

Figure 7:
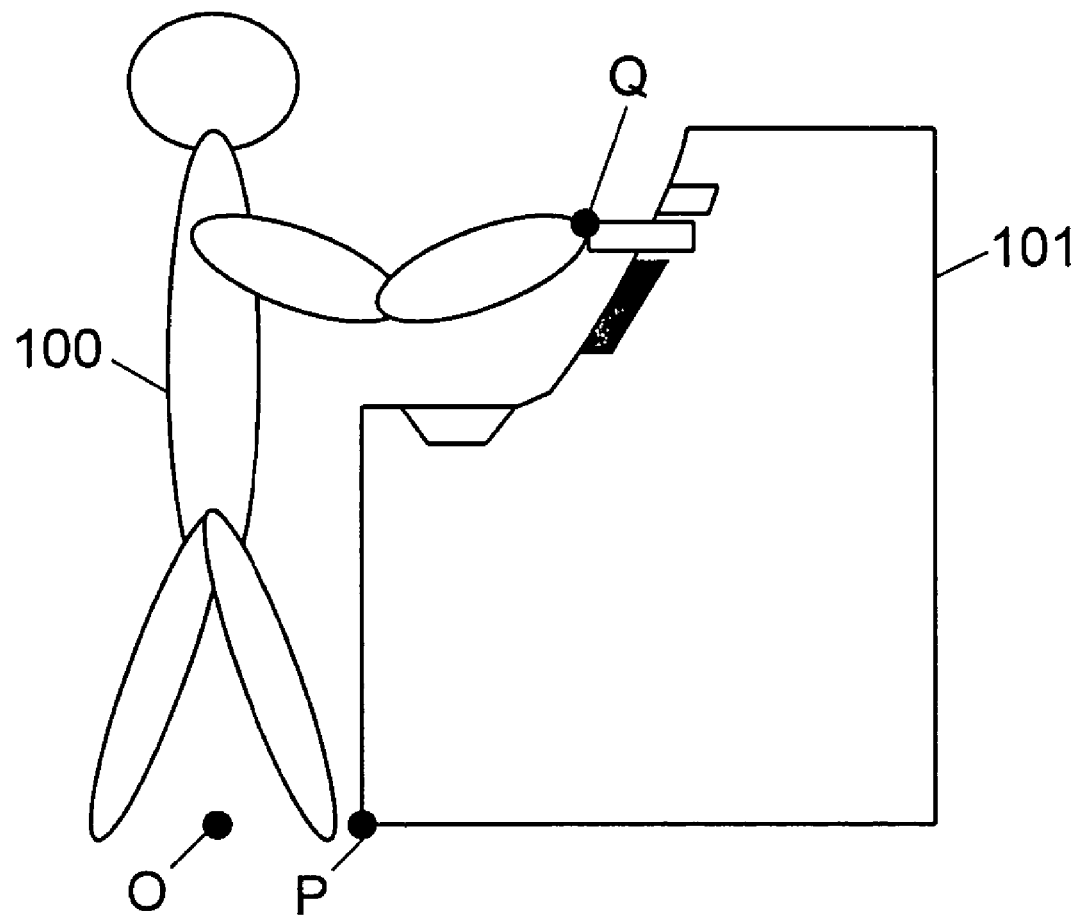
FIG. 7 shows a human body model and an equipment model arranged in a three-dimensional virtual space.

FIG. 7 shows an example of a human body model 100 and an equipment model 101 arranged in the three-dimensional virtual space in a supposed operation. In the example shown in FIG. 7, the reference position of the human body model 100 set in the supposed operation record management table 36 is shown by the coordinates using the point O as an origin, and the position of the equipment model 101 is shown by the coordinates using the point P as an origin. The point Q (control point) is a target position indicated by the target ID set in the supposed operation record management table 36. By changing the physique and posture of the human body model 100, the coordinates of the point Q which has been used are displaced from the target position indicated by the target ID. The posture calculation unit 17 executes again a posture calculation such that the coordinates of the new point Q obtained after the change can match the target position indicated by the target ID depending on the posture (or physique) determined by the new supposed operation after the change.

The "target ID" stores an identifier uniquely identifying the target information. The "visual identification ID" stores an identifier uniquely identifying the visual identification information. The "variation ID" stores an identifier uniquely identifying a variation of the variation target part of an equipment model displayed on the view image. The "item ID" stores an identifier uniquely identifying the item used in each supposed operation. The "supposed time" stores the supposed time supposed from the start to the end of each supposed operation.

FIG. 8 shows an example of the data structure of a test subject operation result record table. The test subject operation result record table 40 stores "item", "scenario ID", "human body type", "selection part", "time", "sample ID", "part determination", "item determination", "operability determination" and so on as associated with the "supposed operation item" for each "supposed operation item" corresponding to the supposed operation executed by a test subject.

The "supposed operation item" stores the record number (the number stored in the "item" of the supposed operation record management table 36) of the supposed operation record management table 36 corresponding to the supposed operation performed by a test subject. The "item" stores the number of each record in the test subject operation result record table 40. The "scenario ID" stores an identifier uniquely identifying the scenario information. The "human body type" stores an identifier uniquely identifying the human body type.

The "selection part" stores the name of a part of the equipment model selected by the parts selection unit 23. For example, the "selection part" stores the name of the part specified by the left mouse button click and so on on the view image by a test subject. The "time" stores the actual operation time (real time) by a test subject. The operation time is the period from the time when a selection part becomes possible to be selected to the time when a selection part is selected. The "sample ID" stores an identifier uniquely identifying a selected sample part. The "part determination" stores a determination result as to whether or not the selection part has been correctly selected. The "item determination" stores the determination result as to whether or not the item has been correctly selected. The "operability determination" stores a determination result of the operability of each supposed operation.

In an embodiment of the present invention, for example, when a selection part is not correctly selected, it is possible to prevent the real time from being stored in the test subject operation result record table 40.

FIG. 9 shows an example of a data structure of an operability evaluation table. The operability evaluation table 41 stores, for example, the rank (rank A) when $1.5T1 > T2$, the rank (rank B) when $2T1 > T2 >= 1.5T1$, and the rank (rank C) when $T2 >= 2T1$ where T1 indicates the supposed time corresponding to each supposed operation, and T2 indicates the real time (operation time). A rank refers to the level of the operability. In the example in the operability evaluation table 41 shown in FIG. 9, the operability level is higher (enhanced operability is acquired) in the order of the ranks A, B, and C.

FIG. 10 shows an example of a data structure of a sample management table. The sample management table 37 stores "item", "target part", "sample ID1", "sample ID2", "sample ID3", "display target" and so on as associated with the "variation ID" for each "variation ID".

The "variation ID" stores an identifier uniquely identifying the variation information about a variation target part. The "item" stores the number of each record of the sample management table 37. The "target part" stores the name of the part replaced by the sample part forming variations. For example, the "target part" stores the name of a variation target part and the name of the accessory part provided for the variation target part. The "sample ID1" to "sample ID3" store an identifier uniquely identifying a sample part which forms variations. For example, they store an identifier of the part replacing a variation target part, and an identifier of a part replacing the accessory part provided for the variation target part. The "display target" stores information identifying a part actually displayed on the view image at the current time. For example, the "display target" stores a name of the accessory part provided for the variation target part displayed on the view image, or an identifier of a sample part displayed on the view image by replacing the accessory part provided for the variation target part.

FIG. 11 shows an example of a data structure of a sample part management table. The sample parts management table 38 stores "item", "part" and so on as associated with the "sample ID" for each "sample ID". The "sample ID" stores an identifier uniquely identifying a sample part. The "item" stores the number of each record in the sample parts management table 38. The "part" stores the concrete name of each sample part.

FIG. 12 shows an example of a data structure of an item management table. The item management table 39 stores "item", "part" and so on as associated with the "item ID" for each "item ID". The "item" stores the number of each record in the item management table 39. The "item ID" stores the identifier uniquely identifying an item. The "part" stores the concrete name of each item.

FIG. 13 is an explanatory view showing the calculation of the operation posture of a human body model by the simulation unit 18.

The example shown in FIG. 13 shows the calculation of a posture performed when the physique of a human body model is changed for easy understanding of the influence of the change in physique and posture on the point Q. However, the calculation of a posture can also be applied when a posture is changed. That is, when the posture is different in a plurality of supposed operations set in one scenario, the coordinates of the point Q can be calculated as follows.

Part A of FIG. 13 shows the human body model 100 having a standard physique (hereinafter referred to as a standard human body model) stored in the human body model storage unit 30 in advance. Part B of FIG. 13 shows the human body model 100 with the physique changed. In FIG. 13, the point Q indicates the target position (operation position) corresponding to a supposed operation.

For example, when the posture calculation unit 17 calculates the posture of moving the right hand as a control point of the standard human body model to the point Q, the simulation unit 18 allows the standard human body model to take the posture as shown in part A of FIG. 13 in the three-dimensional virtual space based on the calculated posture information.

When the input unit 11 inputs the body information about the human body model 100, the simulation unit 18 changes the physique of a standard human body model based on the input body information. Then, the posture calculation unit 17 calculates the posture of moving the right hand as a control point of the human body model 100 having the physique after the change to the point Q, and the simulation unit 18 allows the human body model 100 to take the posture shown in part B of FIG. 13 in the three-dimensional virtual space.

Figure 14:
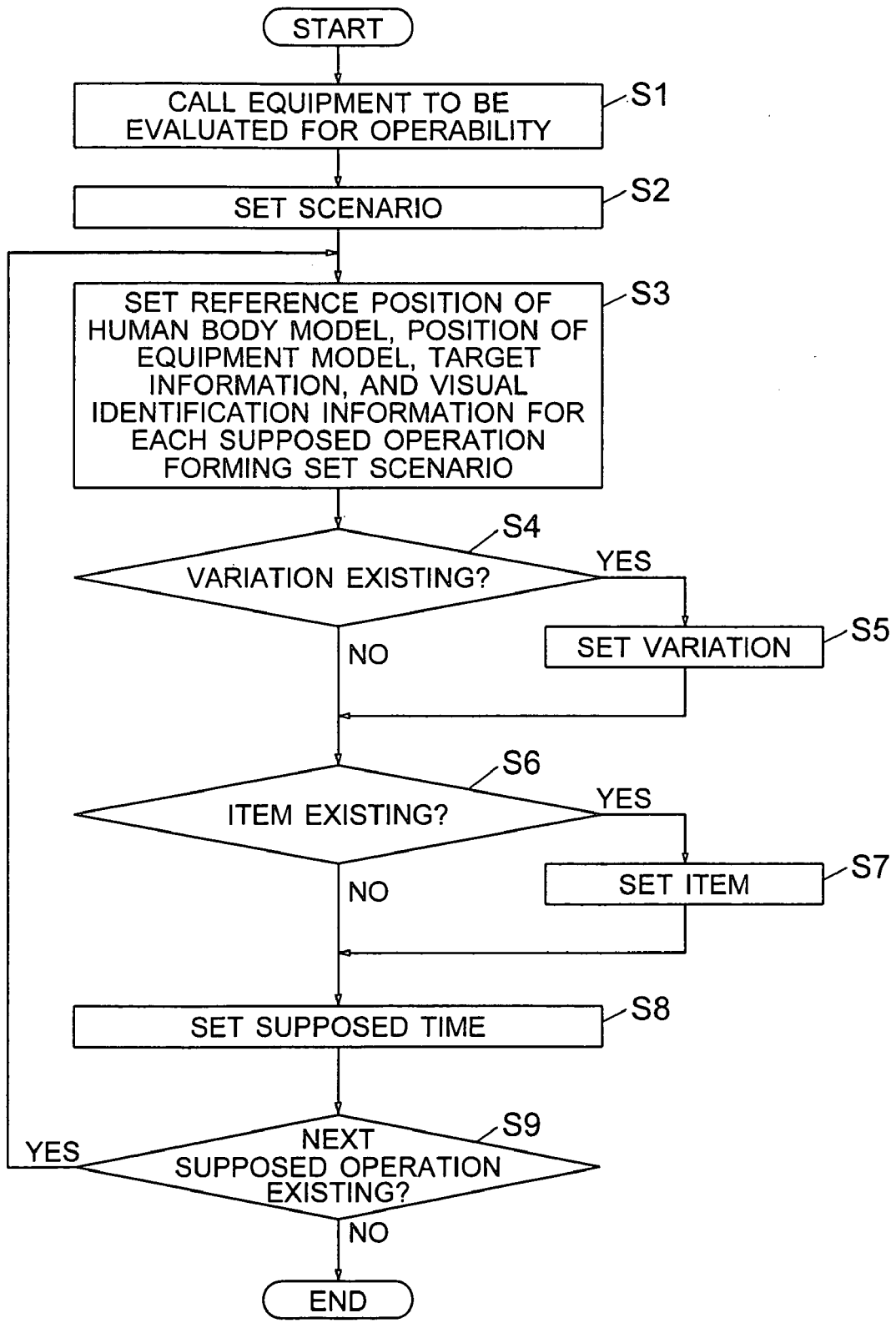
FIG. 14 is an explanatory view showing an example of a flow of a supposed operation setting process according to an embodiment of the present invention.

FIG. 14 is an explanatory view of an example of a process flow of setting a supposed operation in the embodiment of the present invention.

The input unit 11 calls the equipment to be evaluated for operability according to the instruction input of a designer using the input means (omitted in FIG. 1) such as a keyboard, a mouse and so on (step S1). Next, the scenario setting unit 15 sets a scenario according to an instruction input by the designer through the input unit 11 (step S2). For example, the scenario information is set in the scenario management table 35.

Next, the supposed operation setting unit 16 sets the reference position of a human body model, the position of an equipment model, target information, and visual identification information for each supposed operation forming set scenario according to the instruction input of the designer (step S3). For example, in the supposed operation record management table 36, the "human body reference position", "equipment position", "target ID", and "visual identification ID" are set as associated with the supposed operation for each supposed operation.

Next, the supposed operation setting unit 16 determines whether or not there is a variation target part set corresponding to the supposed operation which forms a scenario (step S4). When there is a variation target part for the supposed operation, a variation for the variation target part is set according to the instruction input of the designer (step S5). For example, in the supposed operation record management table 36, a "variation ID" is set.

When there is no variation target part, the process in step S5 is omitted, the designer determines whether or not there is an item available in the supposed operation (step S6). When there is an item, the supposed operation setting unit 16 sets an item according to the instruction input of the designer (step S7). For example, the "item ID" is set-in the supposed operation record management table 36.

When there is no item, the supposed operation setting unit 16 omits the process in step S7, and sets a supposed time corresponding to the supposed operation according to the instruction input by the designer (step S8). For example, the "supposed time" is set in the supposed operation record management table 36.

The supposed operation setting unit 16 determines whether or not there is a next supposed operation (step S9). When there is the next supposed operation, the processes in and after step S3 are repeated. When there is no subsequent supposed operation, the process terminates.

Figure 15:
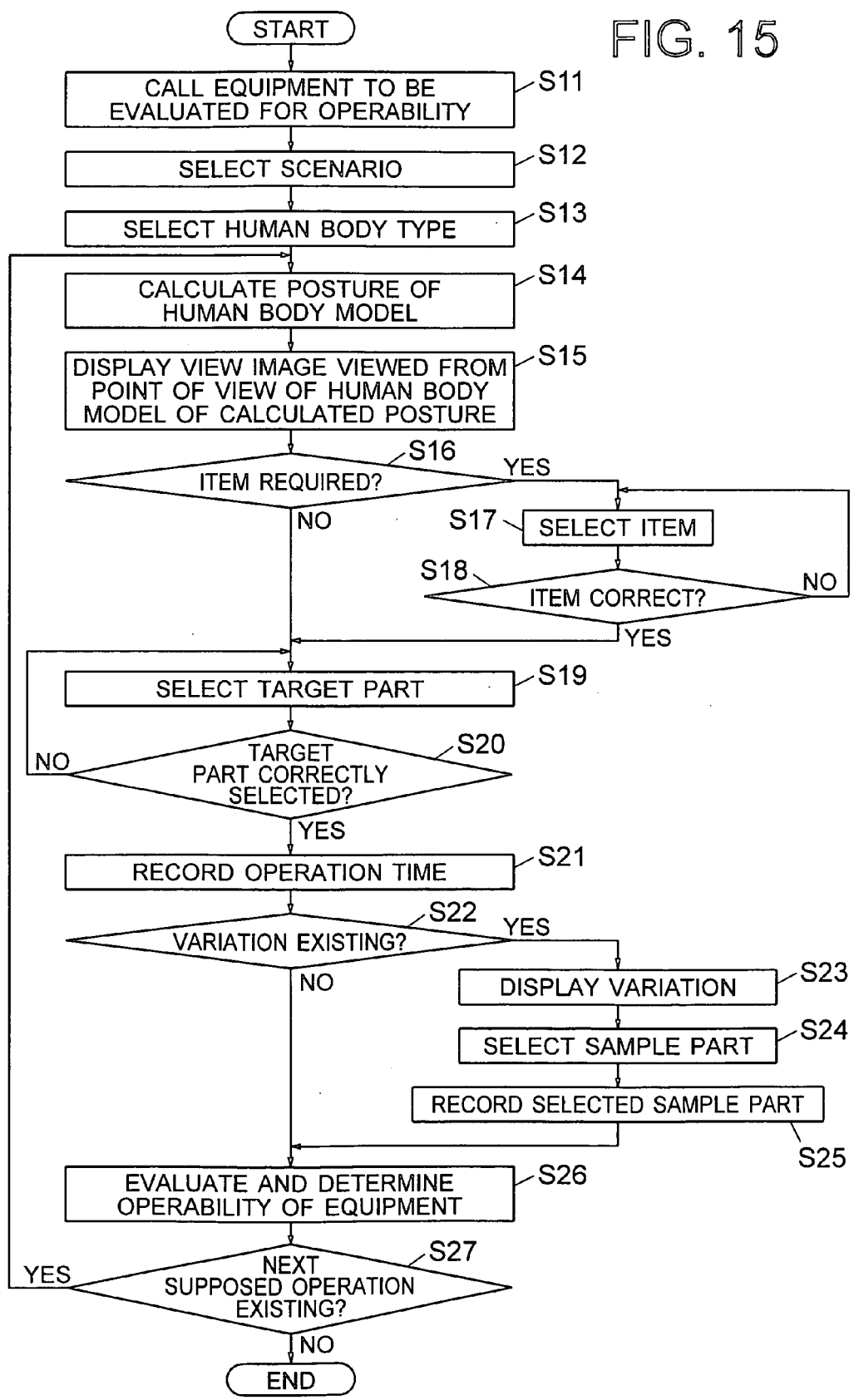
FIG. 15 shows an example of a flow of an equipment operability evaluating process according to an embodiment of the present invention.

FIG. 15 shows an example of the flow of the operability evaluating process of the equipment in an embodiment of the present invention.

The simulation unit 18 calls the equipment to be evaluated for operability according to an instruction input from the input unit 11 by a test subject (or a designer) (step S11). For example, a model of an ATM is called from the equipment model storage unit 31. In this example, in step S11, the simulation unit 18 still calls a standard human body model from the human body model storage unit 30.

Next, the simulation unit 18 selects a scenario according to the instruction input from the input unit 11 by the test subject (or a designer) (step S12). For example, a scenario of "deposit" is selected. The simulation unit 18 selects a human body type according to the instruction input from the input unit 11 by a test subject (or a designer) (step S13). For example, when a value of the height of the test subject is input by the input unit 11, the human body type corresponding to the input value of the height is selected. When the human body type is selected in the process in step S13, the simulation unit 18 changes the physique of the standard human body model to match the physique corresponding to the selected human body type.

Next, the simulation unit 18 (or the posture calculation unit 17) retrieves the leading supposed operation in the unprocessed supposed operations from among a plurality of supposed operations which form the scenario selected in step S12, and passes the operation to the posture calculation unit 17. Thus, the posture calculation unit 17 calculates the posture of the human body model (step S14). That is, the posture calculation unit 17 calculates the posture for moving the control point corresponding to the supposed operation among the order to be currently performed to a target part among the supposed operations which form the scenario selected in step S12.

For example, in step S12, it is assumed that the deposit is selected as a scenario. By referring to the scenario management table 35 shown in FIG. 5, the first supposed operation of the scenario of "deposit" has the "supposed operation ID" of H1. By referring to the supposed operation record management table 36 shown in FIG. 6, the "human body reference position" corresponding to the supposed operation of "selecting a transaction" having the "supposed operation ID" of H1 is set as (0, 0, 0), the "equipment position" is set as (200, 200, 0), the "target ID" is set as T1, and the "visual identification ID" is set as S1.

By referring to the target management table 33 shown in FIG. 3, the "control point" corresponding to the "target ID" of T1 is a right hand, the "target part" is A. part (for example, a transaction selection button). By referring to the visual identification management table 34 shown in FIG. 4, the visual identification target part corresponding to the "visual identification ID" of S1 is A. part.

By referring to the scenario management table 35 shown in FIG. 5 and the supposed operation record management table 36 shown in FIG. 6, the second supposed operation of the scenario of "deposit" is the "inserting a card" having the "supposed operation ID" of H2, and the corresponding "target part" is B. part (for example, a card slot).

Considering the condition that the "human body reference position" is set as (0, 0, 0), and the "equipment position" is set as (200, 200, 0), the posture calculation unit 17, calculates the posture for moving the right hand of the human body model whose physique is changed to A. part which is a target part corresponding to the selection of a transaction as the first supposed operation, and the posture of allowing the human body model to visually recognize A. part as a visual identification target part and allowing B. part which is a target part corresponding to the second supposed operation to be within the range of the view of the human body model. The posture calculation unit 17 can calculate the posture of the human body model without using the information about the target part corresponding to the second supposed operation. The posture calculation unit 17 can also calculate the posture of the human body model with the sight line directed to the target part without using a visual identification target part.

Next, the simulation unit 18 displays a view image viewed from the point of view of the human body model of the posture calculated in step S14 (step S15). For example, a view image as shown in FIG. 16 is displayed. In the view image shown in FIG. 16, reference numeral 200 designates a transaction selection button. The target part in the current supposed operation is assumed to be the transaction selection button 200. The target part in the next supposed operation is assumed to be the card slot 201. The range encompassed by the ellipse shown in FIG. 16 is a range of the view of the human body model in the current supposed operation. As shown in FIG. 16, the card slot 201 which is a target part in the next supposed operation is within the range of the view of the human body model in the current supposed operation.

Next, the item selection unit 27 determines whether or not an item is required (step S16), and when it is determined that an item is required, the item selection unit 27 selects the item (step S17). In the embodiment of the present invention, for example, the simulation unit 18 displays all items (item name and item image) set in the supposed operation record management table 36 in the view image. Then, for example, an item is selected by specifying a specific item name and item image among the displayed item names and item images.

Next, the selection determination unit 29 determines whether or not a selected item is correct (step S18). When a selected item is not correct, the operation recording unit 19 records NG in the item "item determination" of the test subject operation result record table 40, and the processes in and after step S17 are repeated. When a selected item is correct, the operation recording unit 19 records OK in the item "item determination" of the test subject operation result record table 40.

Next, the parts selection unit 23 selects a target part (step S19). For example, in the view image shown in FIG. 16, when the transaction selection button 200 is specified, the parts selection unit 23 selects the transaction selection button 200. When a target part is selected, the operation recording unit 19 records the selected target part in the "selection part" of the test subject operation result record table 40.

Next, the selection determination unit 29 determines whether or not the target part has been correctly selected (step S20). That is, the selection determination unit 29 refers to the supposed operation record management table 36, and determines whether or not a target part corresponding to the current supposed operation has been selected. When the target part has not been correctly selected, the operation recording unit 19 records NG in the item "part determination" of the test subject operation result record table 40, and the processes in and after step S19 are repeated.

When the target part is correctly selected, the operation recording unit 19 records the operation time in the test subject operation result record table 40 (step S21). At this time, the operation time is recorded in the "time" of the test subject operation result record table 40, and OK is recorded in the item "part determination".

Next, the simulation unit 18 determines whether or not there is a variation of a variation target part (step S22). The simulation unit 18 refers to the supposed operation record management table 36, and determines that there is a variation of a variation target part when a variation ID is set for the current supposed operation.

For example, in the first record of the supposed operation record management table 36 shown in FIG. 6, B1 is set as a variation ID corresponding to the supposed operation ID of H1. Additionally, in the sample management table 37 shown in FIG. 10, the target part corresponding to the variation ID of B1 is F. part. Thus, it is determined that there is a variation for F. part of the variation target part in a supposed operation indicated by the supposed operation ID of H1. As shown in the sample management table 37 shown in FIG. 10, three sample IDs of BB1, BB2, and BB3 are set corresponding to F. part. Therefore, a sample part replacing F. part can be three types of parts indicated by the three sample IDs of BB1, BB2, and BB3.

When there is a variation in step S22, the simulation unit 18 displays a variation on the view image (step S23). For example, the simulation unit 18 displays on the view image that there is a sample part replacing the variation target part in the supposed operation indicated by the supposed operation ID of H1, and displays a replacing sample part in a pop-up window when the variation target part is specified on the view image.

For example, by referring to the sample management table 37 shown in FIG. 10 and the sample parts management table 38 shown in FIG. 11, the sample part replacing F. part is L. part, K. part, and G. part. Therefore, the simulation unit 18 displays in a pop-up window three types of sample parts of L. part, K. part, and G. part on the view image.

Next, a sample part is selected (step S24). For example, the sample part is selected by specifying the sample part displayed in the pop-up window on the view image. When the sample part is selected, for example, the display part switch unit 28 replaces a variation target part with the sample part selected in step S24. Furthermore, the simulation unit 18 replaces the variation target part with the selected sample part on the view image. In the processes through step S22 to S24 described above, a sample part easily used by a test subject can be selected from among sample parts forming variations of the variation target part.

The operation recording unit 19 records the selected sample part in the test subject operation result record table 40 (step S25). That is, an identifier uniquely identifying a selected sample part is stored in the "sample ID" of the test subject operation result record table 40.

When there is no variation in step S22, the processes through step S23 to S25 are omitted. Afterwards, the operability evaluation unit 20 evaluates the operability of equipment, and the operability determination unit 21 determines the operability (step S26). For example, the operability evaluation unit 20 determines the level of the operability using the operability evaluation table 41 as shown in FIG. 9 based on the operation time recorded in step S21 and the supposed time corresponding to the supposed operation. For example, the operability evaluation unit 20 determines the level of the operability as rank A or rank B or rank C.

Then, for example, the operability determination unit 21 determines whether the operability is OK or NG based on the level of the operability determined by the operability evaluation unit 20. For example, when the level of the operability is determined as rank A or rank B, the operability is OK. When the level of the operability is determined as rank C, the operability is NG. For example, the determination result of the operability is recorded by the operation recording unit 19 in the item "operability determination" in the test subject operation result record table 40.

In the embodiment of the present invention, the operability evaluation unit 20 can output the operation time recorded in step S21 and the supposed time corresponding to the supposed operation as the parameter of the evaluation of the operability.

The simulation unit 18 determines whether or not there is the next supposed operation (step S27), terminates the process when there is not the next operation, and repeats the processes in and after step S14 when there is the next supposed operation.

As described above, according to the apparatus and method for evaluating equipment operability and the equipment operability evaluating program of the present invention, although a human body model is changed, a view image of a human body model having an appropriate operating posture can be displayed, and the operability of equipment can be evaluated based on the operation result of the equipment model on the view image.

Also according to the apparatus and method for evaluating equipment operability and the equipment operability evaluating program of the present invention, the operability of the equipment in a series of operations performed until the operation purpose of the equipment is attained can be evaluated.

What is claimed is:

1. An apparatus for evaluating equipment operability which evaluates operability of equipment, comprising:
   a physique management unit managing body information about a human body model as a copy of a shape of a human body;
   a visual identification management unit managing visual identification information as information about a sight line of the human body model;
   a target management unit managing a human body part of the human body model and a target position to which the human body part is to be moved as target information;
   a supposed operation setting unit setting a plurality of supposed operations each of which is a supposed operation of the equipment as associated with the visual identification information and the target information;
   a posture calculation unit calculating a posture of the human body model which performs the set supposed operation based on the body information about the specified human body model and at least the target information corresponding to the supposed operation set by the supposed operation setting unit;
   a simulation unit arranging an equipment model as a copy of a shape of the equipment and the human body model having the posture calculated by the posture calculation unit in a three-dimensional virtual space, and displaying a view image as an image of the three-dimensional virtual space from a point of view of the human body model having the posture;
   an operation information input unit inputting operation information about the equipment model in the view image;
   an operation recording unit recording an operation result of the equipment model based on the operation information about the equipment model input by the operation information input unit; and
   an operability evaluation unit evaluating the operability of the equipment based on the recorded operation result of the equipment model.

2. The apparatus for evaluating equipment operability according to claim 1,
   wherein the visual identification management unit manages information about a visual identification target part which is a part to be visually recognized by a human body model as visual identification information among parts provided for an equipment model arranged in the three-dimensional virtual space, and
   wherein the posture calculation unit calculates a posture of the human body model which performs the set supposed operation based on the body information about the specified human body model, and the visual identification information and the target information corresponding to the supposed operation set by the supposed operation setting unit.

3. The apparatus according to claim 2, wherein the posture calculation unit calculates at least information about an angle of a joint of the human body model for moving a human body part of the human body model corresponding to the set supposed operation to the target position to which the human body part is to be moved, and information about a position of eyes of the human body model for allowing the human body model to visually recognize a visual identification target part corresponding to the set supposed operation as posture information.

4. The apparatus according to claim 1, further comprising:
   a scenario setting unit setting a scenario which is a purpose of operating the equipment and is formed by a plurality of supposed operations,
   wherein the supposed operation setting unit sets the supposed operation for each of the set scenario, and
   wherein the posture calculation unit calculates a posture of the human body model which performs the set supposed operation based on the body information of the specified human body model and the specified scenario.

5. The apparatus according to claim 4,
   wherein the scenario set by the scenario setting unit is formed by supposed operations whose operation orders are preset, and
   wherein the posture calculation unit calculates the posture of the human body model which performs supposed operations forming the specified scenario in an order of supposed operations forming the specified scenario.

6. The apparatus according to claim 1,
   wherein the supposed operation setting unit sets a supposed time as a time supposed from the start to the end of the supposed operation,
   wherein the operation recording unit records the operation time of the equipment model on the view image, and
   wherein the operability evaluation unit evaluates the operability of the equipment based on the result of the comparison between the recorded operation time of the equipment model and the set supposed time.

7. The apparatus according to claim 6, wherein the operability evaluation unit ranks the operability of the equipment.

8. The apparatus according to claim 1, further comprising:
   an operation determination unit determining whether or not the equipment model is operated according to the supposed operation set by the supposed operation setting unit based on the operation information about the equipment model input by the operation information input unit,
   wherein the operation recording unit records a determination result by the operation determination unit, and
   wherein the operability evaluation unit evaluates the operability of the equipment based on the determination result recorded by the operation recording unit.

9. The apparatus according to claim 1, further comprising:
   a sample selection unit selecting a sample part to replace a variation target part which has display and shape variations among parts of the equipment model; and
   a display part switching unit displaying the sample part selected by the sample selection unit in place of the variation target part on the view image,
   wherein the target management unit manages a human body part of the human body model and a target part which is a part of the equipment model and is at a target position to which the human body part is to be moved as the target information, and
   wherein the supposed operation setting unit sets one or more of sample parts replacing the variation target part as associated with the supposed operation.

10. The apparatus according to claim 1,
wherein the supposed operation setting unit sets an item required for the supposed operation as associated with the supposed operation,
wherein the simulation unit displays an item set by the supposed operation setting unit on the view image, and
wherein the operation recording unit records a comparison result between an item selected on the view image and an item set by the supposed operation setting unit.

11. A method for evaluating equipment operability, the method comprising:
managing body information about a human body model as a copy of a shape of a human body;
managing visual identification information as information about a sight line of the human body model;
managing a human body part of the human body model and a target position to which the human body part is to be moved as target information;
setting a plurality of supposed operations each of which is a supposed operation of the equipment as associated with the visual identification information and the target information;
calculating a posture of the human body model which performs the set supposed operation based on the body information about the specified human body model and at least the target information corresponding to the set supposed operation;
arranging an equipment model as a copy of a shape of the equipment and the human body model having the calculated posture in a three-dimensional virtual space, and displaying a view image as an image of the three-dimensional virtual space from a point of view of the human body model having the posture;
recording an operation result of the equipment model based on an inputted operation information about the equipment model on the view image; and
evaluating the operability of the equipment based on the recorded operation result of the equipment model.

12. A computer readable storage medium recording a program for evaluating operability of equipment, the program causing a computer to execute:
managing body information about a human body model as a copy of a shape of a human body;
managing visual identification information as information about a sight line of the human body model;
managing a human body part of the human body model and a target position to which the human body part is to be moved as target information;
setting a plurality of supposed operations each of which is a supposed operation of the equipment as associated with the visual identification information and the target information;
calculating a posture of the human body model which performs the set supposed operation based on the body information about the specified human body model and at least the target information corresponding to the set supposed operation;
arranging an equipment model as a copy of a shape of the equipment and the human body model having the calculated posture in a three-dimensional virtual space, and displaying a view image as an image of the three-dimensional virtual space from a point of view of the human body model having the posture;
recording an operation result of the equipment model based on an inputted operation information about the equipment model on the view image; and
evaluating the operability of the equipment based on the recorded operation result of the equipment model.

* * * * *